(12) United States Patent
Partsch et al.

(10) Patent No.: US 6,711,091 B1
(45) Date of Patent: Mar. 23, 2004

(54) INDICATION OF THE SYSTEM OPERATION FREQUENCY TO A DRAM DURING POWER-UP

(75) Inventors: Torsten Partsch, Chapel Hill, NC (US); Jennifer Huckaby, Raleigh, NC (US); Johnathan T. Edmonds, Cary, NC (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/256,539

(22) Filed: Sep. 27, 2002

(51) Int. Cl.[7] .............................. G11C 8/18; G11C 7/22
(52) U.S. Cl. ........................................ 365/233; 711/167
(58) Field of Search ........................... 365/233; 711/167

(56) References Cited

U.S. PATENT DOCUMENTS

| | | | |
|---|---|---|---|
| 6,259,652 B1 | 7/2001 | Heyne et al. ........... 365/189.01 |
| 6,272,035 B1 | 8/2001 | Dietrich et al. ................ 365/63 |
| 6,275,445 B1 | 8/2001 | Dietrich et al. .............. 365/233 |
| 6,285,176 B1 | 9/2001 | Marx et al. ................... 323/313 |
| 6,285,228 B1 | 9/2001 | Heyne et al. ................ 327/246 |
| 6,351,167 B1 | 2/2002 | Hein et al. ................... 327/158 |
| 6,366,527 B2 | 4/2002 | Hein et al. ................... 365/233 |
| 6,388,944 B2 | 5/2002 | Schrogmeier et al. ....... 365/233 |
| 6,434,082 B1 * | 8/2002 | Hovis et al. ................. 365/233 |
| 6,480,024 B2 | 11/2002 | Dietrich et al. ................ 326/38 |
| 6,553,472 B2 * | 4/2003 | Yang et al. .................. 711/167 |
| 2001/0033523 A1 | 10/2001 | Hein et al. ................... 365/233 |
| 2001/0038566 A1 | 11/2001 | Schrögmeier et al. ....... 365/223 |
| 2002/0075707 A1 | 6/2002 | Dietrich et al. ................ 363/60 |
| 2002/0079925 A1 | 6/2002 | Dietrich et al. ................ 326/83 |
| 2002/0089319 A1 | 7/2002 | Heyne et al. ................ 323/313 |
| 2002/0093855 A1 | 7/2002 | Heyne et al. ................ 365/194 |
| 2002/0133750 A1 | 9/2002 | Dietrich et al. ................. 714/30 |
| 2002/0141279 A1 | 10/2002 | Dietrich et al. ............. 365/233 |
| 2002/0144173 A1 * | 10/2002 | Jeddeloh ..................... 713/501 |
| 2003/0001636 A1 | 1/2003 | Partsch et al. .............. 327/158 |
| 2003/0012322 A1 | 1/2003 | Partsch et al. .............. 375/376 |

* cited by examiner

Primary Examiner—Michael S. Lebentritt
Assistant Examiner—J. H. Hur
(74) Attorney, Agent, or Firm—Brinks Hofer Gilson & Lione

(57) ABSTRACT

A method of using a memory chip includes operating a memory chip of a memory system and sending a command signal to the memory chip, wherein the command signal contains information regarding an operational frequency of a system clock signal of the memory system. The method provides the advantage of enabling high operation frequencies and thus increasing the SDRAM internal timing margin.

18 Claims, 5 Drawing Sheets

THE INTERSECTION OF A ROW AND COLUMN IS THE LOCATION OF A MEMORY BIT.

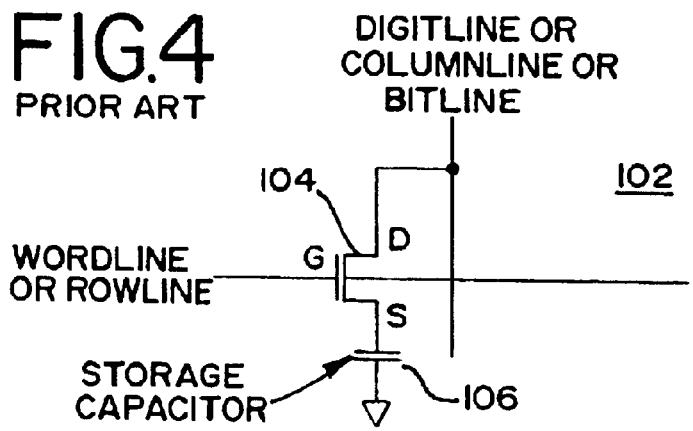

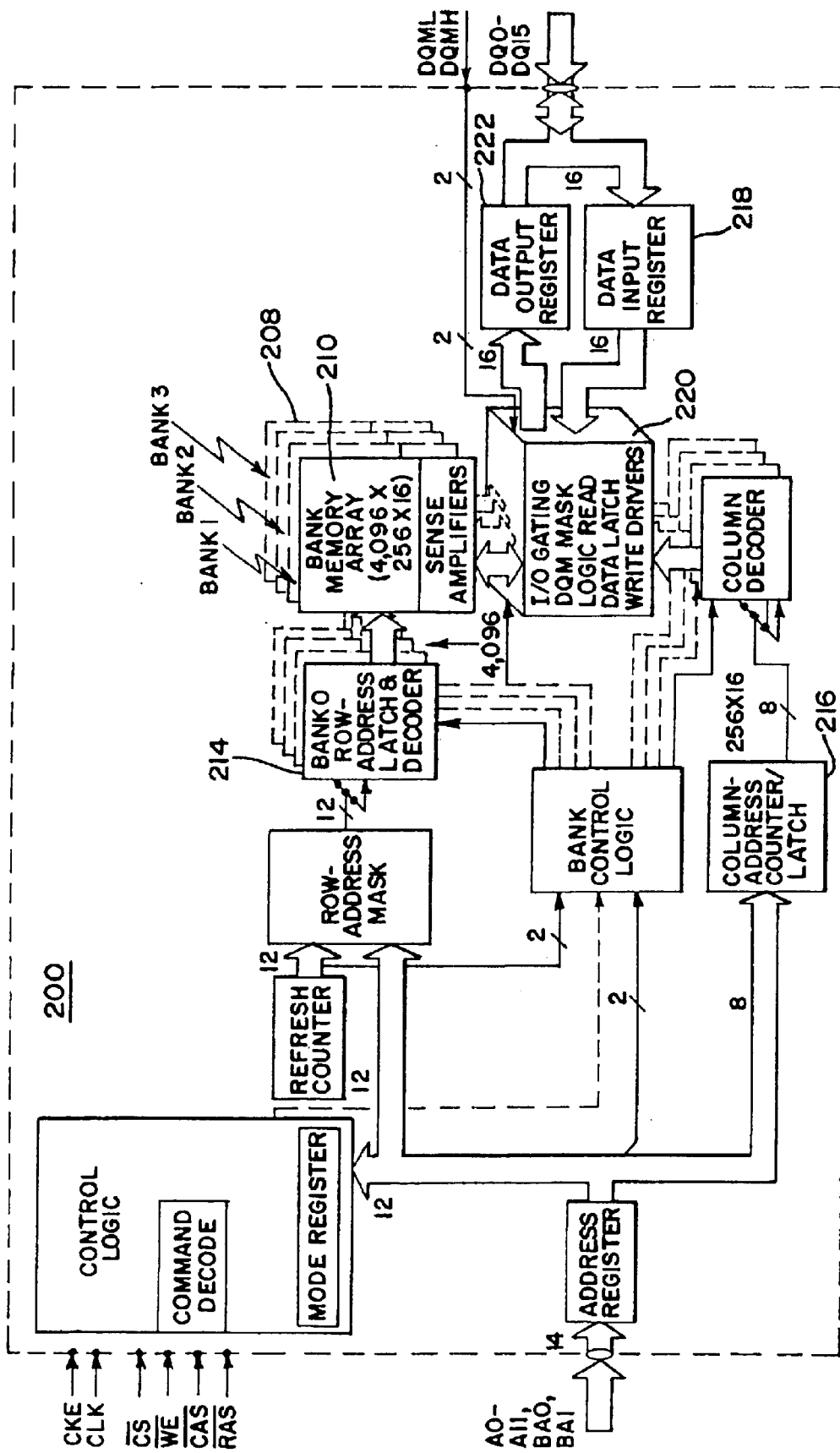

INDICATION OF THE SYSTEM OPERATION FREQUENCY TO A DRAM DURING POWER-UP

BACKGROUND OF THE INVENTION

1. Field of the Invention

The present invention relates to the field of memory chips.

2. Discussion of Related Art

A known integrated memory IC 100 that is a writeable memory of the DRAM type is shown in FIG. 1. Such a dynamic random access memory (DRAM) chip 100 includes a plurality of memory storage cells 102 in which each cell 102 has a transistor 104 and an intrinsic capacitor 106 (as shown in FIG. 4). As shown in FIGS. 2 and 3, the memory storage cells 102 are arranged in arrays 108, wherein memory storage cells 102 in each array 108 are interconnected to one another via columns of conductors 110 and rows of conductors 112. The transistors 104 are used to charge and discharge the capacitors 106 to certain voltage levels. The capacitors 106 then store the voltages as binary bits, 1 or 0, representative of the voltage levels. The binary 1 is referred to as a "high" and the binary 0 is referred to as a "low." The voltage value of the information stored in the capacitor 106 of a memory storage cell 102 is called the logic state of the memory storage cell 102.

As shown in FIGS. 1 and 2, the memory chip 100 includes six address input contact pins A0, A1, A2, A3, A4, A5 along its edges that are used for both the row and column addresses of the memory storage cells 102. The row address strobe (RAS) input pin receives a signal RAS that clocks the address present on the DRAM address pins A0 to A5 into the row address latches 114. Similarly, a column address strobe (CAS) input pin receives a signal CAS that clocks the address present on the DRAM address pins A0 to A5 into the column address latches 116. The memory chip 100 has data pin Din that receives data and data pin Dout that sends data out of the memory chip 100. The modes of operation of the memory chip 100, such as Read, Write and Refresh, are well known and so there is no need to discuss them for the purpose of describing the present invention.

A variation of a DRAM chip is shown in FIGS. 5 and 6. In particular, by adding a synchronous interface between the basic core DRAM operation/circuitry of a second generation DRAM and the control coming from off-chip a synchronous dynamic random access memory (SDRAM) chip 200 is formed. The SDRAM chip 200 includes a bank of memory arrays 208 wherein each array 208 includes memory storage cells 210 interconnected to one another via columns and rows of conductors.

As shown in FIGS. 5 and 6, the memory chip 200 includes twelve address input contact pins A0–A11 that are used for both the row and column addresses of the memory storage cells of the bank of memory arrays 208. The row address strobe (RAS) input pin receives a signal RAS that clocks the address present on the DRAM address pins A0 to A11 into the bank of row address latches 214. Similarly, a column address strobe (CAS) input pin receives a signal CAS that clocks the address present on the DRAM address pins A0 to A11 into the bank of column address latches 216. The memory chip 200 has data input/output pins DQ0–15 that receive and send input signals and output signals. The input signals are relayed from the pins DQ0–15 to a data input register 218 and then to a DQM processing component 220 that includes DQM mask logic and write drivers for storing the input data in the bank of memory arrays 208. The output signals are received from a data output register 222 that received the signals from the DQM processing component 220 that includes read data latches for reading the output data out of the bank of memory arrays 208. The modes of operation of the memory chip 200, such as Read, Write and Refresh, are well known and so there is no need to discuss them for the purpose of describing the present invention.

A variation of the SDRAM chip 200 is a double-data-rate SDRAM (DDR SDRAM) chip. The DDR SDRAM chip imparts register commands and operations on the rising edge of the clock signal while allowing data to be transferred on both the rising and falling edges of the clock signal. Differential input clock signals CLK and CLK(bar) are used in the DDR SDRAM. A major benefit of using a DDR SDRAM is that the data transfer rate can be twice the clock frequency because data can be transferred on both the rising and falling edges of the CLK clock input signal.

It is noted that new generations of memory systems that employ SDRAM and DDR SDRAM chips are increasing their frequency range. Currently, SDRAM and DDR SDRAM chips are unable to determine the frequency at which they are operating in a particular memory system. As the frequency range of the memory system widens, it can pose some problems for the SDRAM and DDR SDRAM chips. For example, a DDR SDRAM chip has to time operations between different clocking domains. It is known that the clocking domains change their relative timing to one another as a function of the operating frequency of the memory system. This change in relative timing is illustrated in FIGS. 7 and 8.

In the case of a slow operating frequency, such as 66 MHz, the system clock signal VCLK is directed to the clock pin of the DDR SDRAM. The system clock signal VCLK generates within the DDR SDRAM an internal clock signal ICLK that clocks the central command unit of the DDR SDRAM. This means that all internal commands generated by the central command unit are synchronized with the internal clock signal ICLK. As shown in FIG. 7, while the internal clock signal ICLK has the same frequency as the system clock signal VCLK, it lags the system clock signal VCLK by a constant amount tMAR2. The lag is caused by several gate and propagation delays. This lag results in a phase shift between the ICLK signal and the VCLK signal that becomes bigger as the frequency of the clock signals is raised. This phase shift increase is a result of the relation of the constant tMAR2 to the cycle time that decreases with increasing frequency.

As shown in FIG. 7, a second internal clock signal DCLK is generated by a DLL of the DDR SDRAM. The internal clock signal DCLK and the system clock signal VCLK each have the same frequency. However, the internal clock signal DCLK is advanced with respect to the system clock signal VCLK by a constant amount tMAR1 that is dependent on the chip temperature, process variation and the operating frequency. The purpose of advancing the internal clock signal DCLK relative to the system clock signal VCLK is to time internal events within the DDR SDRAM so that they are edge aligned with the system clock signal VCLK when observed at the external DDR SDRAM pin.

As shown in FIG. 7, the signal $SIG_{clk1}$ is generated synchronously with the clock signal ICLK. Next, the signal $SIG_{clk1}$ is synchronized with and handled to the internal clock signal DCLK. As shown in FIG. 7, the signal $SIG_{clk2}$ shows the timing of the signal after latching (synchronizing) the signal $SIG_{clk1}$ to the internal clock signal DCLK domain. Signal $SIG'_{clk2}$ shows the signal $SIG_{clk2}$ after being shifted by one clock cycle DCLK.

As shown in FIG. 8, a different situation occurs when the system operates at a fast operating frequency, such as 200 MHz. In particular, while the internal clock signal ICLK still has the same frequency as the system clock signal VCLK, it lags the system clock signal VCLK by a constant amount tMAR2 that results in a greater phase delay than that shown in the slow frequency case described previously with respect to FIG. 7. In addition, while the internal clock signal DCLK and the system clock signal VCLK each have the same frequency, the internal clock signal DCLK is advanced with respect to the system clock signal VCLK by a constant amount tMAR1 that is also greater than the phase delay described previously with respect to the slow frequency case of FIG. 7. As shown in FIG. 8, the signal $SIG_{clk1}$ is generated synchronously with respect to the clock signal. Similarly, the signal $SIG_{clk1}$ now has to be synchronized and handled to the internal clock signal DCLK. As shown in FIG. 8, the signal $SIG_{clk2}$ shows the timing of the signal $SIG_{clk1}$ after being latched (synchronized) to the internal clock signal DCLK domain. The signal $SIG_{clk2}$ of FIG. 8 shows the signal $SIG_{clk2}$ after being shifted by one clock cycle of the internal clock signal DCLK. The end result is that the relative timing of the clock signals ICLK and DCLK in the fast frequency case is drastically different when compared with the slow frequency case.

With the above-described disparity in the relative timing it makes it very difficult to run commands within the DDR SDRAM in a consistent manner independent of the operating frequency of the system. For example, suppose that an output signal of the DDR SDRAM needs to be observed three VCLK cycles after the generation of the signal $SIG_{CLK1}$. If the system was in the slow frequency mode, then the output signal would occur upon the DDR SDRAM chip counting the four DCLK pulses T0, T1, T2 and T3. In contrast, the output signal would occur after the chip counted only the three DCLK pulses T1, T2 and T3 in the fast frequency mode. Thus, the DDR SDRAM chip is unable to consistently run the output command based solely on the number of DCLK pulses counted. This inconsistency limits the maximum frequency at which the DDR SDRAM can be operated with a DDR system.

SUMMARY OF THE INVENTION

One aspect of the present invention regards a method of using a memory chip that includes operating a memory chip of a memory system and sending a command signal to the memory chip, wherein the command signal contains information regarding an operational frequency of a system clock signal of the memory system.

The above aspect of the present invention provides the advantage of simplifying control SDRAM control logic and therefore reducing die size.

The above aspect of the present invention provides the advantage of enabling high operation frequencies and thus increasing the SDRAM internal timing margin.

The present invention, together with attendant objects and advantages, will be best understood with reference to the detailed description below in connection with the attached drawings.

BRIEF DESCRIPTION OF THE DRAWINGS

FIG. 4 schematically shows an embodiment of a memory cell to be used with the memory array of FIG. 3;

FIG. 5 schematically shows a top view of a second embodiment of a known memory chip;

FIG. 6 shows a block diagram of the memory chip of FIG. 5;

DETAILED DESCRIPTION OF THE INVENTION

Figure 9:
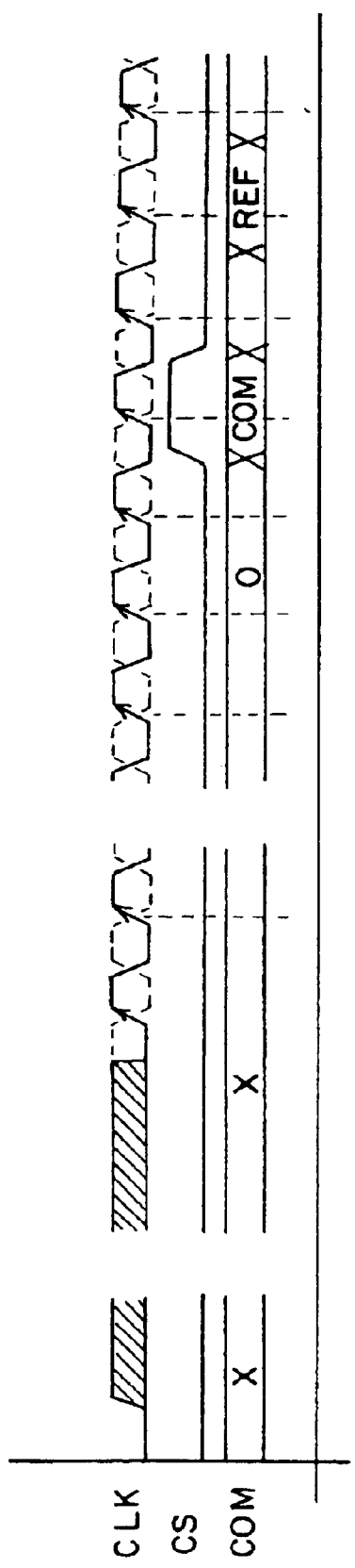
FIG. 9 shows a timing diagram showing a first embodiment of a power up command series for the memory systems of FIGS. 1–6 according to the present invention.

As shown in FIG. 9, a synchronous power up command series for the memory chips 100 and 200 of FIGS. 1–6 and the previously described DDR SDRAM chip is shown. It should be noted that the present invention can be used with other types of memory chips that need to synchronize signals between independent scaling clocking phases, such as DDR SGRAM, DDR2 SDRAM and SRAM memory chips. In particular, a command COM is latched onto a specific timing protocol at or near the end of the power up sequence of the memory chip when the external or system clock is stable. Note that the power up sequence is chosen because it occurs prior to the issuance of any commands within the memory chip. The command COM specifies a specific value or range of values for the system operation/system clock frequency. Consequently, the system operations/system clock frequency can be used for all internal commands that occur after power up.

As shown in FIG. 9, a possible timing protocol is to generate the command COM during the chip select CS signal and just before the mandatory refresh command REF in a DRAM memory chip's power up sequence. The command COM can also be generated just after the refresh command REF. In either event, the memory chip has obtained, via the command COM, the operation/system clock frequency which is stable no matter whether the system frequency is high or low. Accordingly, output signals can be consistently identified by the memory irrespective of the operating frequency.

Figure 10:
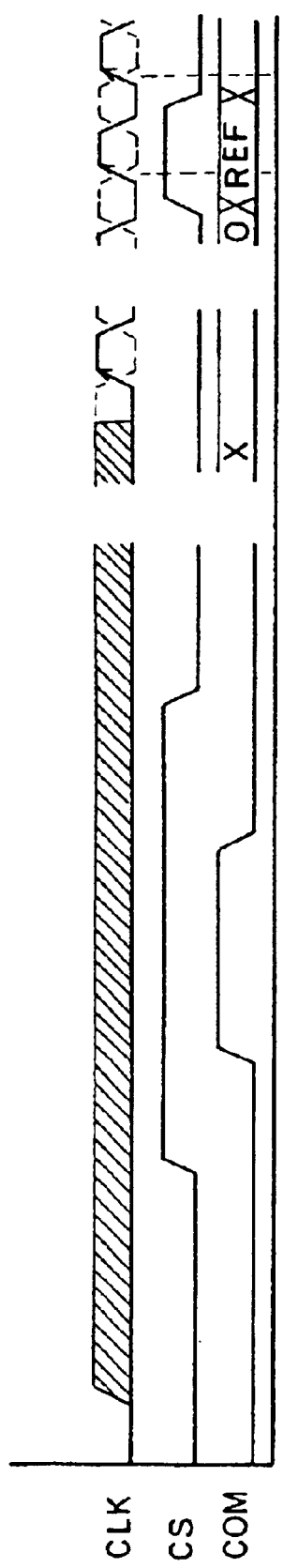
FIG. 10 shows a timing diagram showing a second embodiment of a power up command series for the memory systems of FIGS. 1–6 according to the present invention.

Another method of specifying a system operation frequency to the memory chip is shown in FIG. 10. In this method, a command COM is issued any time after the system power has been established. In this scenario, the system clock is not necessarily stable and so the command COM is not latched onto the system clock or any specified timing protocol. Accordingly, the command COM has to be issued asynchronously with respect to the system clock. In this mode of operation, at chip select CS high, the command COM results in the controller of the memory chip comparing the voltage levels of the pins of the memory chip and determining which of the pins are at a high state and which pins are at a low state. The controller then decodes the high and low state pins so as to determine a target frequency or target frequency range Thus, the memory chip has again obtained the operation/system clock frequency which is stable no matter whether the system frequency is high or low. Accordingly, output signals can be consistently identified by the memory irrespective of the operating frequency.

Figure 1:
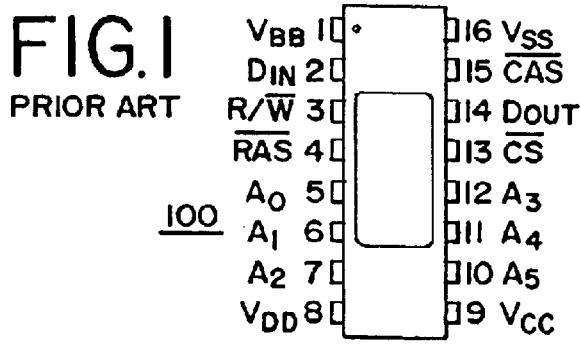
FIG. 1 schematically shows a top view of an embodiment of a known memory chip.
Figure 2:
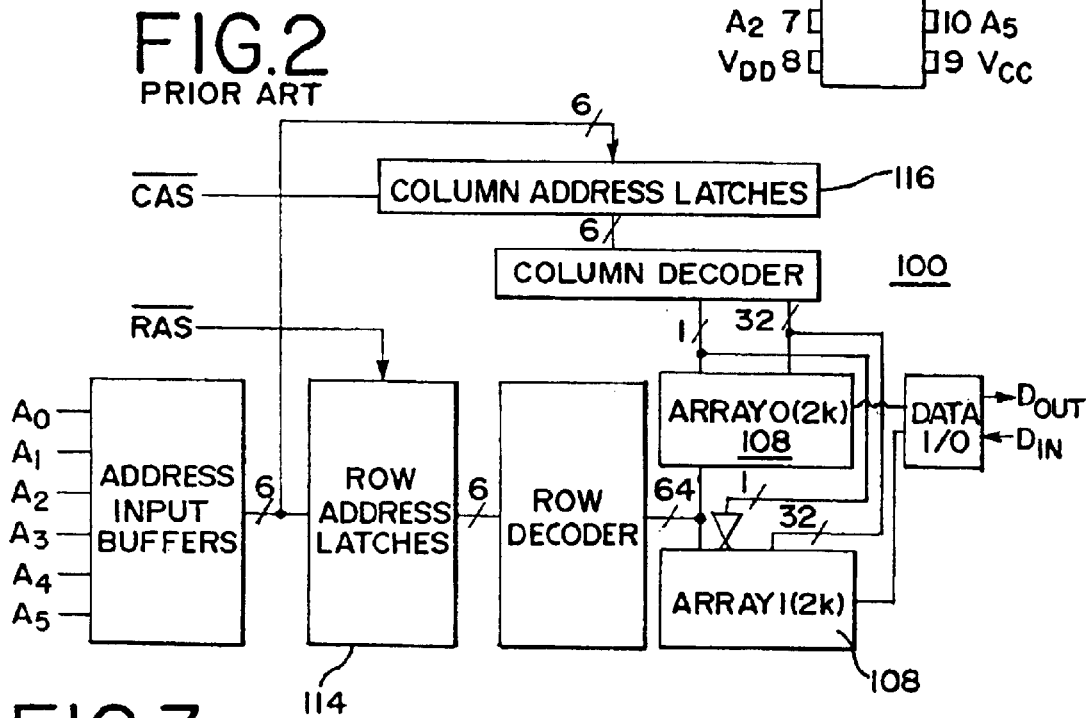
FIG. 2 shows a block diagram of the memory chip of FIG. 1.
Figure 3:
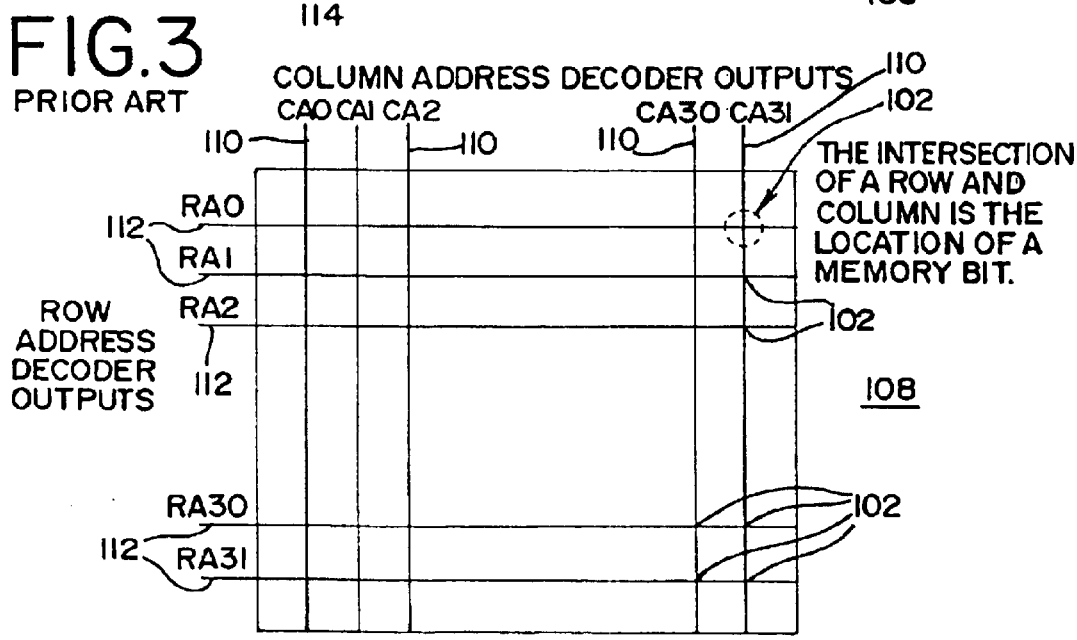
FIG. 3 schematically shows an embodiment of a memory array to be used with the memory chip of FIG. 1.
Figure 7:
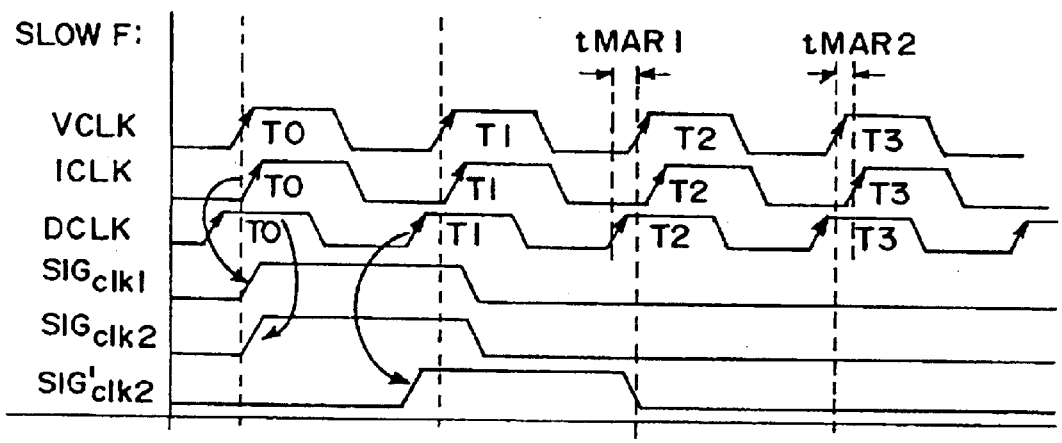
FIG. 7 shows a first timing diagram for a third embodiment of a known memory chip.
Figure 8:
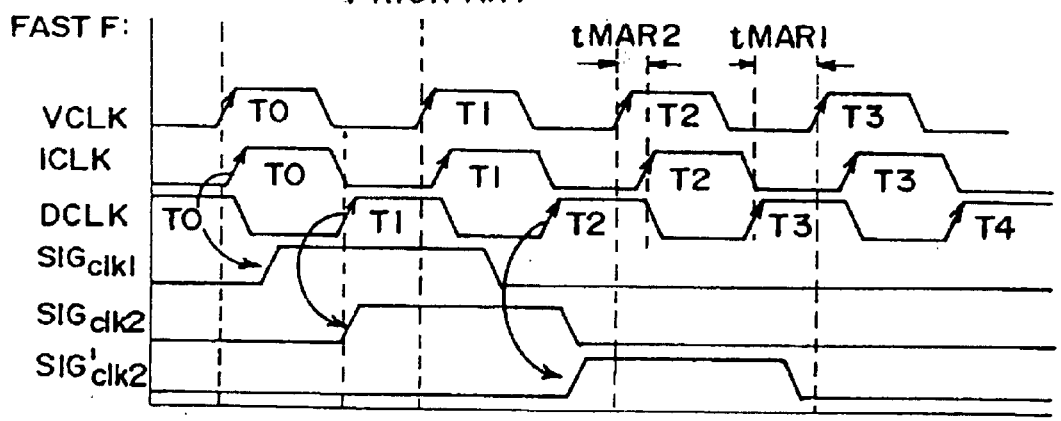
FIG. 8 shows a second timing diagram for the third embodiment of a known memory chip.

Once the operation/system clocking frequency is determined in the manner described above, the determined clocking frequency can be used to improve the operation of the memory system. For example, the delay line length of a delay-locked-loop of a DDR SDRAM can be pre-adjusted based on the determined clocking frequency so as to be decreased to the delay-locked-loop's locking time and possibly its power consumption. In addition, memory chip internal signals can be safely synchronized to different phased clocking domains at a higher frequency range based on the determined clocking frequency. The determined clocking frequency can also be used to indicate timing protocols for devices that are specified to run in different types of systems. This provides the advantage that one memory chip would be able to meet different output specifications (e.g. different specifications for different grades of speed (high-/low-end systems)). Meeting different output specifications saves development and production costs. In addition, the determined clocking frequency can be stored on the memory chip and be used for choosing different computing modes, such as delaying the timing of an internal clock of the memory chip so as to correct the situation discussed previously with respect to FIGS. 7 and 8.

The foregoing description is provided to illustrate the invention, and is not to be construed as a limitation. Numerous additions, substitutions and other changes can be made to the invention without departing from its scope as set forth in the appended claims.

We claim:

1. A method of using a memory chip comprising:
   operating a memory chip of a memory system;
   sending a command signal to said memory chip, wherein said command signal contains information regarding an operational frequency of a system clock signal of said memory system.

2. The method of claim 1, wherein said operating comprises performing a timing protocol of said memory chip.

3. The method of claim 2, wherein said sending comprises latching a command signal onto said timing protocol.

4. The method of claim 3, wherein said latching is performed at a period of time when said system clock signal is stable.

5. The method of claim 3, wherein said timing protocol generates said command signal in sequence with a refresh command.

6. The method of claim 5, wherein said command is generated just after said refresh command.

7. The method of claim 5, wherein said command is generated just before said refresh command.

8. The method of claim 3, further comprising powering up said memory chip via a power up sequence, wherein said timing protocol is said power up sequence.

9. The method of claim 8, wherein said latching is performed at a period of time when said system clock signal is stable.

10. The method of claim 8, wherein said timing protocol generates said command signal in sequence with a refresh command.

11. The method of claim 10, wherein said command is generated just after said refresh command.

12. The method of claim 10, wherein said command is generated just before said refresh command.

13. The method of claim 1, wherein said sending is made absent of latching to a timing protocol.

14. The method of claim 13, further comprising comparing voltage levels of pins of said memory chip.

15. The method of claim 14, further comprising decoding said voltage levels of pins of said memory chip so as to determine said operational frequency.

16. The method of claim 1, wherein said memory chip comprises a DRAM memory chip.

17. The method of claim 1, wherein said memory chip comprises a SDRAM memory chip.

18. The method of claim 1, wherein said memory chip comprises a DDR SDRAM memory chip.

* * * * *